United States Patent
Ando et al.

(10) Patent No.: US 10,833,127 B2
(45) Date of Patent: Nov. 10, 2020

(54) THREE-DIMENSIONAL AND PLANAR MEMORY DEVICE CO-INTEGRATION

(71) Applicant: INTERNATIONAL BUSINESS MACHINES CORPORATION, Armonk, NY (US)

(72) Inventors: Takashi Ando, Tuckahoe, NY (US); Michael Rizzolo, Delmar, NY (US); Chih-Chao Yang, Glenmont, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/294,285

(22) Filed: Mar. 6, 2019

(65) Prior Publication Data
US 2020/0286956 A1    Sep. 10, 2020

(51) Int. Cl.
| H01L 21/44 | (2006.01) |
| H01L 29/40 | (2006.01) |
| H01L 27/24 | (2006.01) |
| H01L 45/00 | (2006.01) |
| H01L 27/108 | (2006.01) |

(52) U.S. Cl.
CPC ...... *H01L 27/2481* (2013.01); *H01L 27/1085* (2013.01); *H01L 45/1226* (2013.01); *H01L 45/1233* (2013.01)

(58) Field of Classification Search
CPC .................................................. H01L 27/1085

USPC .................................. 257/774; 438/672–675
See application file for complete search history.

(56) References Cited

U.S. PATENT DOCUMENTS

| 6,882,553 | B2 | 4/2005 | Nejad et al. | |
| 7,504,730 | B2 | 3/2009 | Marshfield | |
| 8,203,884 | B2* | 6/2012 | Kito | H01L 27/11565 257/316 |
| 8,803,206 | B1 | 8/2014 | Or-Bach et al. | |
| 8,846,484 | B2 | 9/2014 | Lee et al. | |
| 8,969,945 | B2* | 3/2015 | Kito | H01L 27/11565 257/324 |
| 9,093,370 | B2* | 7/2015 | Hwang | H01L 27/249 |
| 9,721,961 | B2* | 8/2017 | Okajima | H01L 27/2481 |
| 9,847,378 | B2 | 12/2017 | Sheng et al. | |
| 10,224,372 | B2* | 3/2019 | Mori | H01L 45/04 |
| 2012/0074466 | A1 | 3/2012 | Setiadi et al. | |

(Continued)

OTHER PUBLICATIONS

Baek, "Realization of Vertical Resistive Memory (VRRAM) Using Cost Effective 3D Process", 2011 International Electron Devices Meeting, Dec. 2011, 4 pages.

(Continued)

*Primary Examiner* — Calvin Lee
(74) *Attorney, Agent, or Firm* — Tutunjian & Bitetto, P.C.; L. Jeffrey Kelly

(57) ABSTRACT

A method for fabricating a semiconductor device including three-dimensional and planar memory device co-integration includes forming trenches within a horizontal electrode stack to expose portions of a conductive layer, forming vertical electrodes including conductive material within the trenches, forming a planar memory device stack across the device, and patterning the planar memory device stack to form a planar memory device.

19 Claims, 8 Drawing Sheets

(56) References Cited

U.S. PATENT DOCUMENTS

2015/0021537 A1    1/2015  Xie et al.

OTHER PUBLICATIONS

Gokmen, "Acceleration of Deep Neural Network Training with Resistive Cross-Point Devices: Design Considerations, Frontiers in Neuroscience", vol. 10, Article 333, Jul. 2016, 13 pages.

Wong, "Metal-Oxide RRAM", Proceedings of the IEEE, vol. 100, No. 6, Jun. 2012, pp. 1951-1970.

* cited by examiner

THREE-DIMENSIONAL AND PLANAR MEMORY DEVICE CO-INTEGRATION

BACKGROUND

The present invention generally relates to semiconductor devices, and more particularly to three-dimensional and planar memory device co-integration.

A memory cell is a component of a computer memory device that includes an electronic circuit that stores one bit of binary information. One type of memory cell is a random-access memory (RAM) cell. Examples of RAM memory devices include, e.g., volatile memory devices and non-volatile memory devices. One example of a non-volatile memory is resistive random-access memory (ReRAM). ReRAM technology works by creating defects in a thin dielectric layer (e.g., oxygen vacancies in a thin metal oxide layer), which can charge and drift under an electric field. The motion of ions and vacancies in the thin dielectric layer is similar to the motion of electrons and holes in a semiconductor. ReRAM technology can be used for electronic synapse devices, memristors for neuromorphic computing, and high-density/high-speed non-volatile memory applications. For example, in neuromorphic computing applications, ReRAM can be used as a connection or synapse between a pre-neuron and a post-neuron, representing the connection weight in the form of device resistance, and multiple pre-neurons and post-neurons can be connected through a crossbar array of ReRAM devices to express a fully-connected neural network.

SUMMARY

In accordance with an embodiment of the present invention, a method for fabricating a semiconductor device including three-dimensional and planar memory device co-integration is provided. The method includes forming trenches within a horizontal electrode stack to expose portions of a conductive layer, forming vertical electrodes including conductive material within the trenches, forming a planar memory device stack across the device, and patterning the planar memory device stack to form a planar memory device.

In accordance with another embodiment of the present invention, a semiconductor device including three-dimensional and planar memory device co-integration is provided. The device includes a vertical memory device including vertical electrodes, and a planar memory device disposed on the vertical memory device and connected to the vertical memory device in series.

In accordance with yet another embodiment of the present invention, a semiconductor device including three-dimensional and planar memory device co-integration is provided. The device includes a vertical memory device including vertical electrodes, and a planar memory device independent from the vertical memory device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
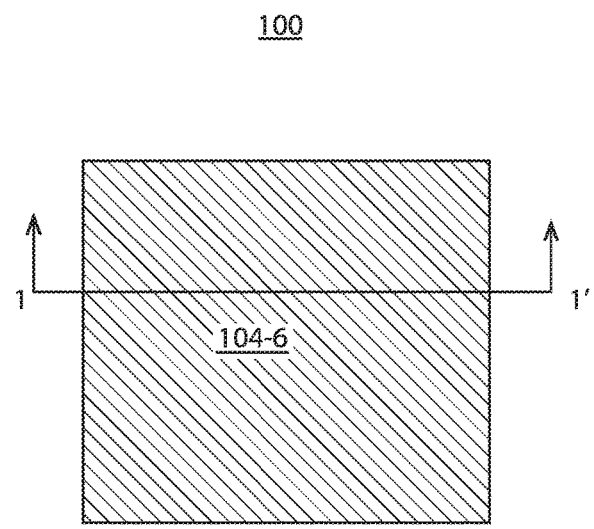
FIG. 1 is a top-down view of the formation of dielectric layers on a conductive layer during the fabrication of a semiconductor device, in accordance with an embodiment of the present invention.

Density of resistive random-access memory (ReRAM) can be increased by vertically stacking ReRAM stacks (e.g., as practiced in Flash NAND technology. However, ReRAM stacks are generally deposited by physical vapor deposition (PVD) to control the defect concentration in the thin dielectric layer (e.g., oxygen vacancy concentration in the metal oxide layer), which can prevent application to three-dimensional structures and thus can limit the potential for density scaling.

To address at least the above concerns, the embodiments described herein provide co-integration of three-dimensional (e.g., vertical) memory devices and two-dimensional (e.g., horizontal) memory devices. In one embodiment, the memory devices include resistive random-access memory (ReRAM) memory devices. The three-dimensional memory devices can be used for dense memory areas needed lower endurance, while the two-dimensional memory devices can be used for critical paths needing fast switching speed and higher endurance. Accordingly, the embodiments described herein can attain high quality switching and density scaling beyond two-dimensional devices.

The three-dimensional memory devices can utilize atomic layer deposition (ALD) or chemical vapor deposition (CVD) based electrode materials as films, and the two-dimensional memory devices can utilize physical vapor deposition (PVD) based electrode materials as films. Such a structure can increase potential for density scaling and can provide memory devices with improved quality vis-à-vis increased controllability of film stoichiometry and reduced film impurities. In one illustrative embodiment, the vertical and horizontal memory devices can shared common vertical vias. In another illustrative embodiment, the vertical and horizontal memory devices have independent electrode lines with checkered patterns for density scaling.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a top-down view of a semiconductor device 100 is provided. In one embodiment, the device 100 includes a resistive random-access memory (ReRAM) device. However, the device 100 can include any suitable memory device(s) in accordance with the embodiments described herein. As shown in FIG. 1, the device 100 is shown including a dielectric layer 104-6, as will be further described below with reference to FIG. 2.

Figure 2:
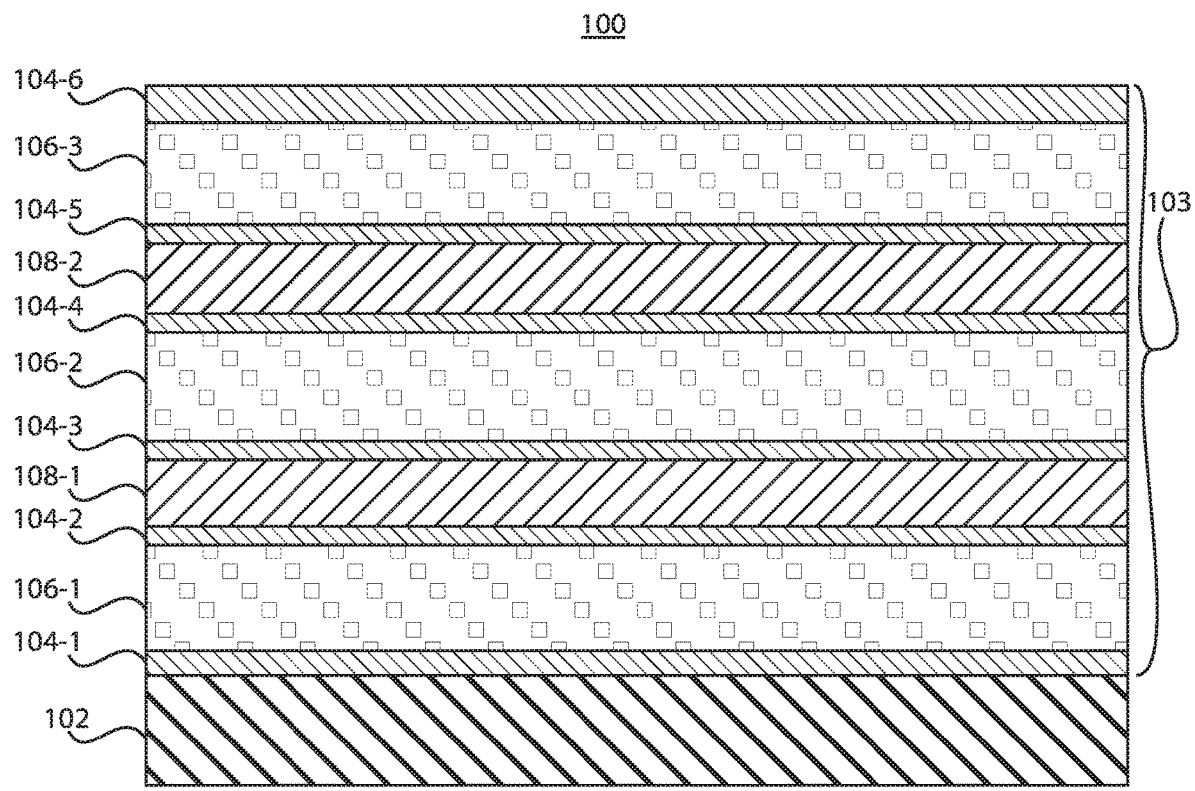
FIG. 2 is a cross-sectional view through the semiconductor device of FIG. 1, in accordance with an embodiment of the present invention.

With reference to FIG. 2, a cross-sectional view of the device 100 through line 1-1' is provided. As shown, the device 100 includes a conductive layer 102 and a horizontal electrode stack 103 formed on the conductive layer 102. In one embodiment, the conductive layer 102 includes a metal. Examples of suitable materials that can be used to form the conductive layer 102 include, but are not limited to, copper (Cu), tungsten (W), cobalt (Co), aluminum (Al), etc.

In this illustrative example, the horizontal electrode stack 103 includes layers 104-1 through 104-3, 106-1 through 106-3, and 108-1 and 108-2. In one embodiment, the layers 104-1 through 104-3 and 108-1 and 108-2 can each include a nitride material, and the layer 106-1 through 106-3 can each include an oxide material. For example, the layers 104-1 through 104-3 can include a silicon nitride material (e.g., SiN), the layers 106-1 through 106-3 can include a silicon dioxide material (e.g., $SiO_2$), and the layers 108-1 and 108-2 can include a titanium nitride material (e.g., TiN). However, the layers of the horizontal electrode stack 103 can include any suitable materials or combinations of materials in accordance with the embodiments described herein.

Figure 3:
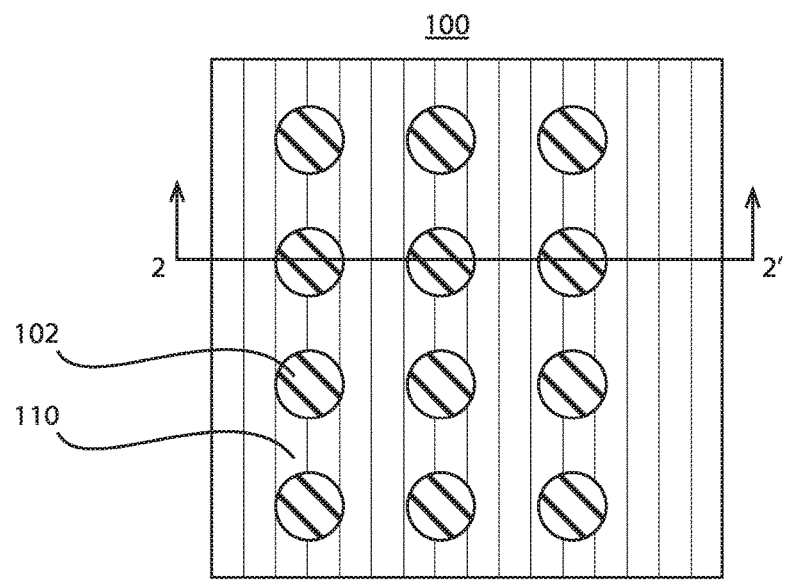
FIG. 3 is a top-down view of the formation of a hardmask and etching performed to create trenches during the fabrication of the semiconductor device, in accordance with an embodiment of the present invention.

With reference to FIG. 3, a top-down view of the device 100 is provided illustrating the formation of a hardmask 110 and trenches (not shown) exposing portions of the conductive layer 102. The hardmask 110 can be formed (e.g., deposited) on the horizontal electrode stack 103 by chemical vapor deposition (CVD) and/or other related methods, and can include any suitable material in accordance with the embodiments described herein. For example, the hardmask 110 can include, e.g., silicon oxides, silicon carbides, silicon nitrides, silicon carbonitrides, spin-on dielectrics, or other suitable materials. Spin-on dielectrics that can be utilized as material for the hardmask 110 include, but are not limited to, silsequioxanes, siloxanes, and boron phosphate silicate glass (BPSG). Further details regarding the trenches will now be described with reference to FIG. 4.

Figure 4:
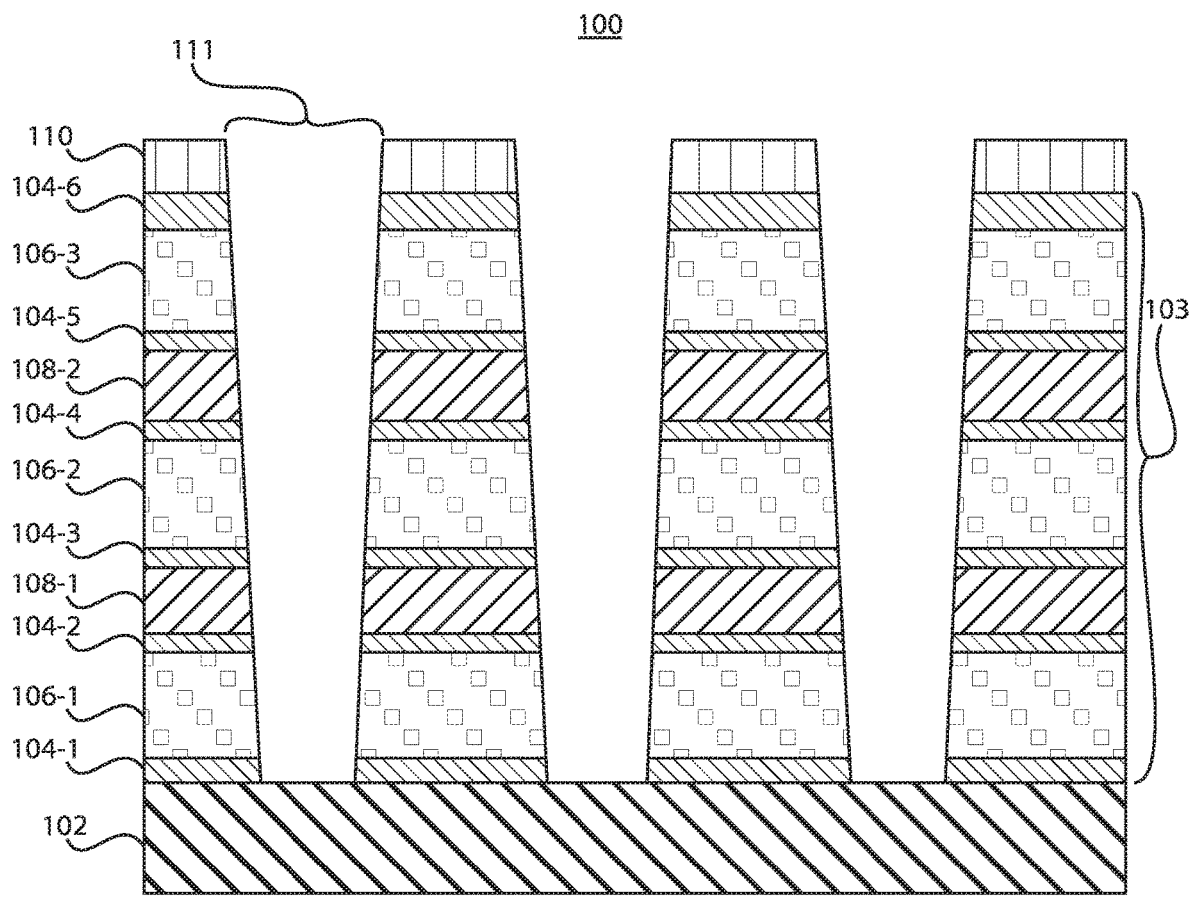
FIG. 4 is a cross-sectional view through the semiconductor device of FIG. 3, in accordance with an embodiment of the present invention.

With reference to FIG. 4, a cross-sectional view of the device 100 through line 2-2' is provided. As shown, trenches 111 are formed. The trenches 111 can be formed by etching corresponding portions of the device 100 through the hardmask 110 to the conductive layer 102. Any suitable process can be used to form the trenches 111 in accordance with the embodiments described herein.

Figure 5:
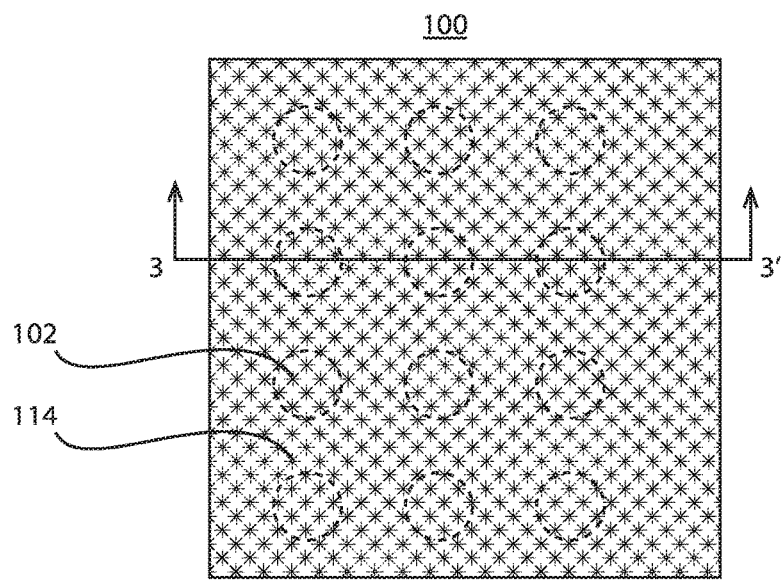
FIG. 5 is a top-down view of the formation of memory device material layers during the fabrication of the semiconductor device, in accordance with an embodiment of the present invention.

With reference to FIG. 5, a top-down view of the device 100 is provided illustrating the removal of the remaining material of the hardmask 110, and the formation of a dielectric layer (not shown in FIG. 5) and a reactive electrode layer 114 of a vertical memory device stack. The dotted circles shown in FIG. 5 represent an outline of the trenches 111. Further details regarding the formation of the vertical memory device stack will now be described with reference to FIG. 6.

Figure 6:
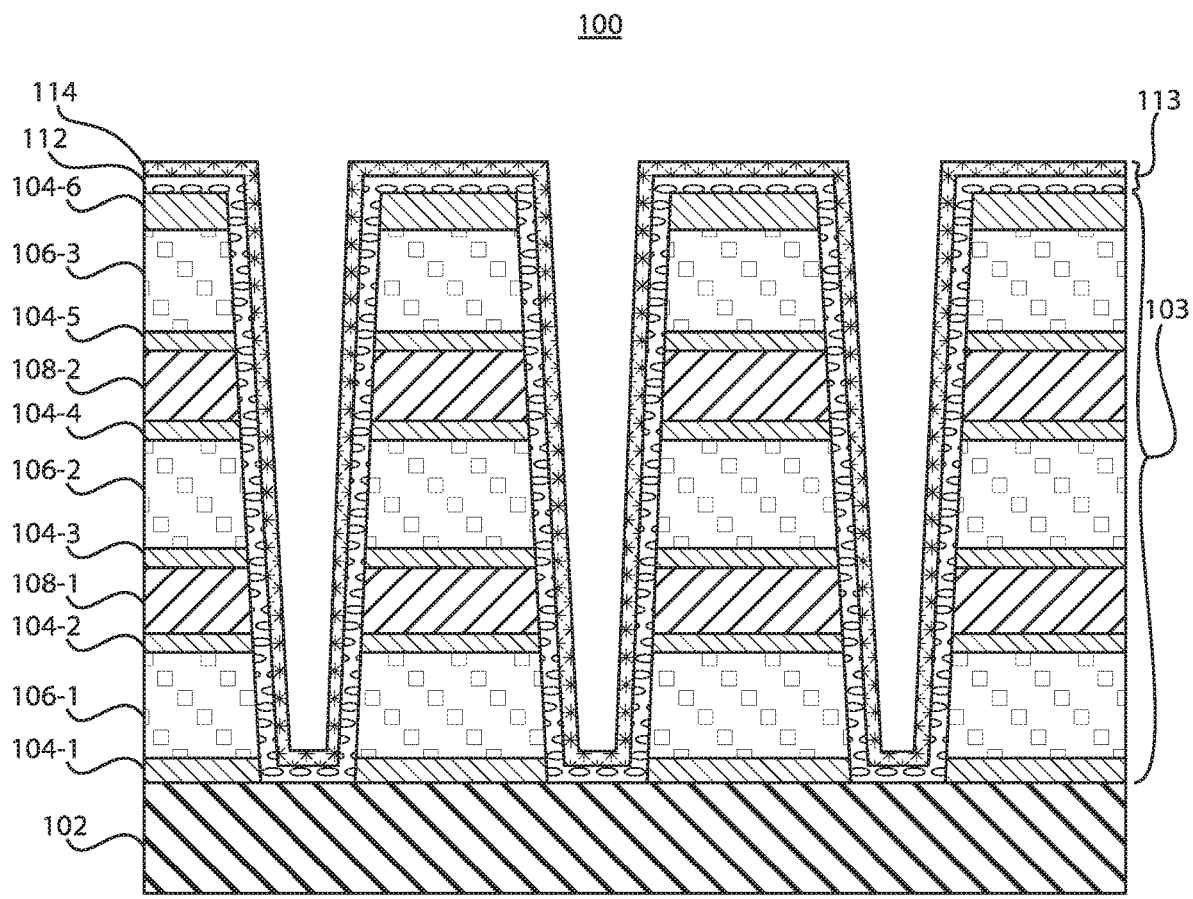
FIG. 6 is a cross-sectional view through the semiconductor device of FIG. 5, in accordance with an embodiment of the present invention.

With reference to FIG. 6, a cross-sectional view of the device 100 through line 3-3' is provided. As shown, vertical memory device stack 113 including a dielectric layer 112 (e.g., a thin dielectric layer) and a reactive electrode layer 114 is formed. For example, the dielectric layer 112 can be deposited (e.g., conformally deposited) along exposed surfaces of the layers of the stack 103 and the conductive layer 102, and the reactive electrode layer 114 can be deposited (e.g., conformally deposited) along the thin dielectric layer 112. The dielectric layer 112 and the reactive electrode layer 114 can be formed using any suitable processes and can include any suitable materials in accordance with the embodiments described herein. In one embodiment, the dielectric layer 112 can include a metal oxide. For example, the dielectric layer 112 can include, e.g., a hafnium oxide material (e.g., $HfO_2$), a tantalum oxide material (e.g., $Ta_2O_5$), or other suitable materials. In one embodiment, the reactive electrode layer 114 can include an alloy. For example, the reactive electrode layer 114 can include, e.g., a Ti and/or an Al-containing material (e.g., TiN/TiAlC/TiN).

Figure 7:
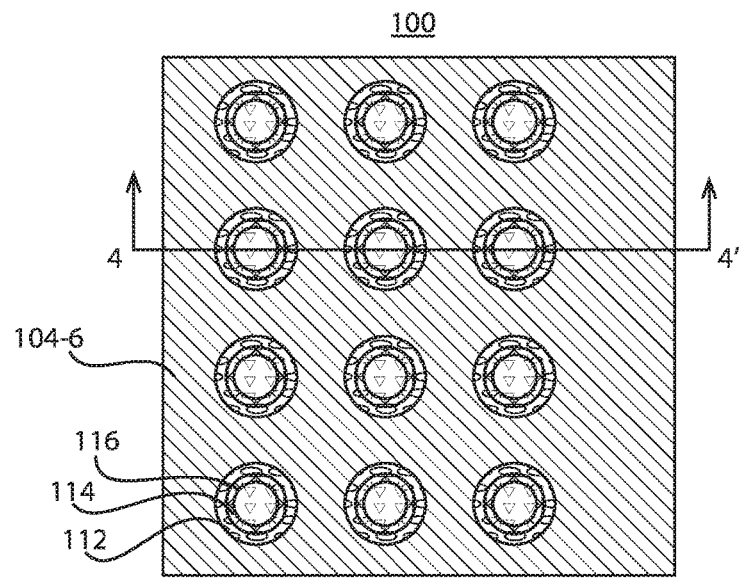
FIG. 7 is a top-down view of the filling of the trenches with conductive material and planarization performed to form electrodes during the fabrication of the semiconductor device, in accordance with an embodiment of the present invention.

With reference to FIG. 7, a top-down view of the device 100 is provided illustrating the formation of vertical electrodes 116 by filling of the trenches 111 with conductive material and planarizing. The vertical electrodes 116 can include any suitable material in accordance with the embodiments described herein. For example, the vertical electrodes 116 can include, e.g., tungsten (W) or copper (Cu). Any suitable planarization method can be used in accordance with the embodiments described herein (e.g., chemical-mechanical planarization (CMP)). Further details regarding the formation of the vertical electrodes 116 will now be described with reference to FIG. 8.

Figure 8:
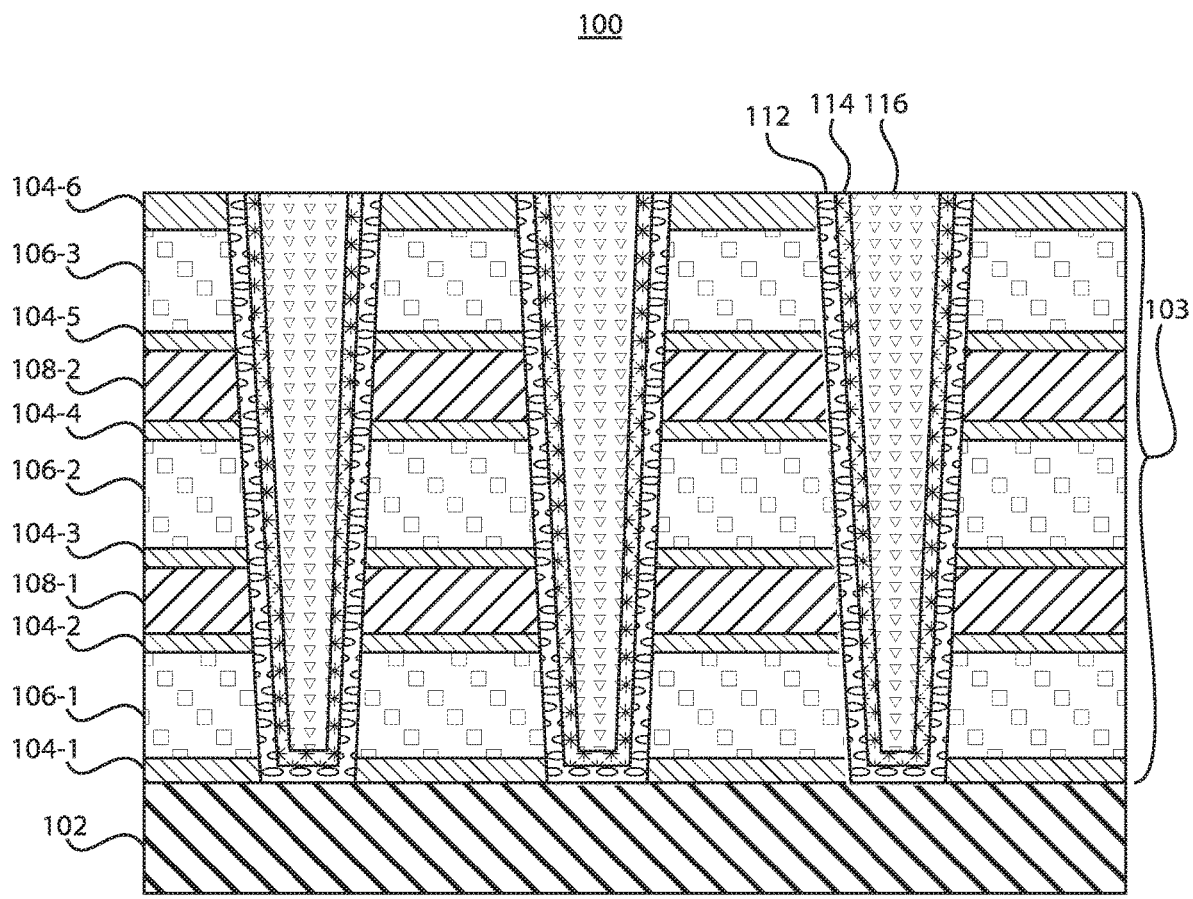
FIG. 8 is a cross-sectional view through the semiconductor device of FIG. 7, in accordance with an embodiment of the present invention.

With reference to FIG. 8, a cross-sectional view of the device 100 through line 4-4' is provided. As shown, the planarization can stop on the layer 104-6.

Figure 9:
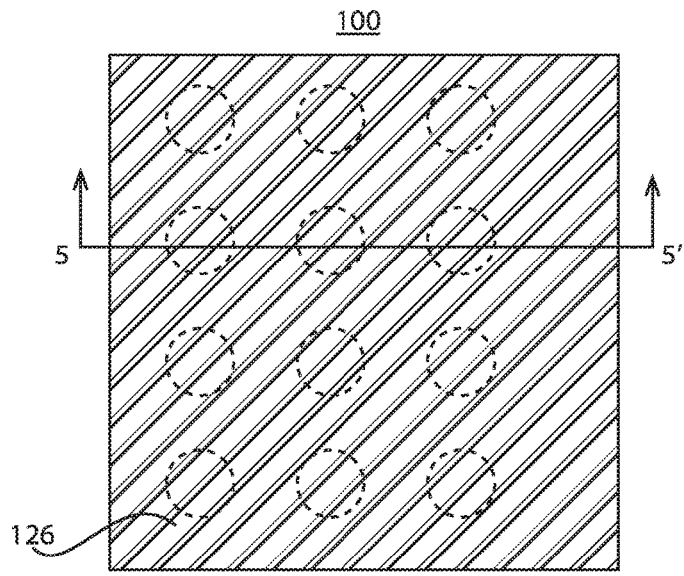
FIG. 9 is a top-down view of the formation of a memory device stack during the fabrication of the semiconductor device, in accordance with an embodiment of the present invention.

With reference to FIG. 9, a top-down view of the device 100 is provided illustrating the formation of a top layer 126 of a planar memory device stack (e.g., planar ReRAM stack). Further details regarding the formation of the planar electrode stack will now be described with reference to FIG. 10.

Figure 10:
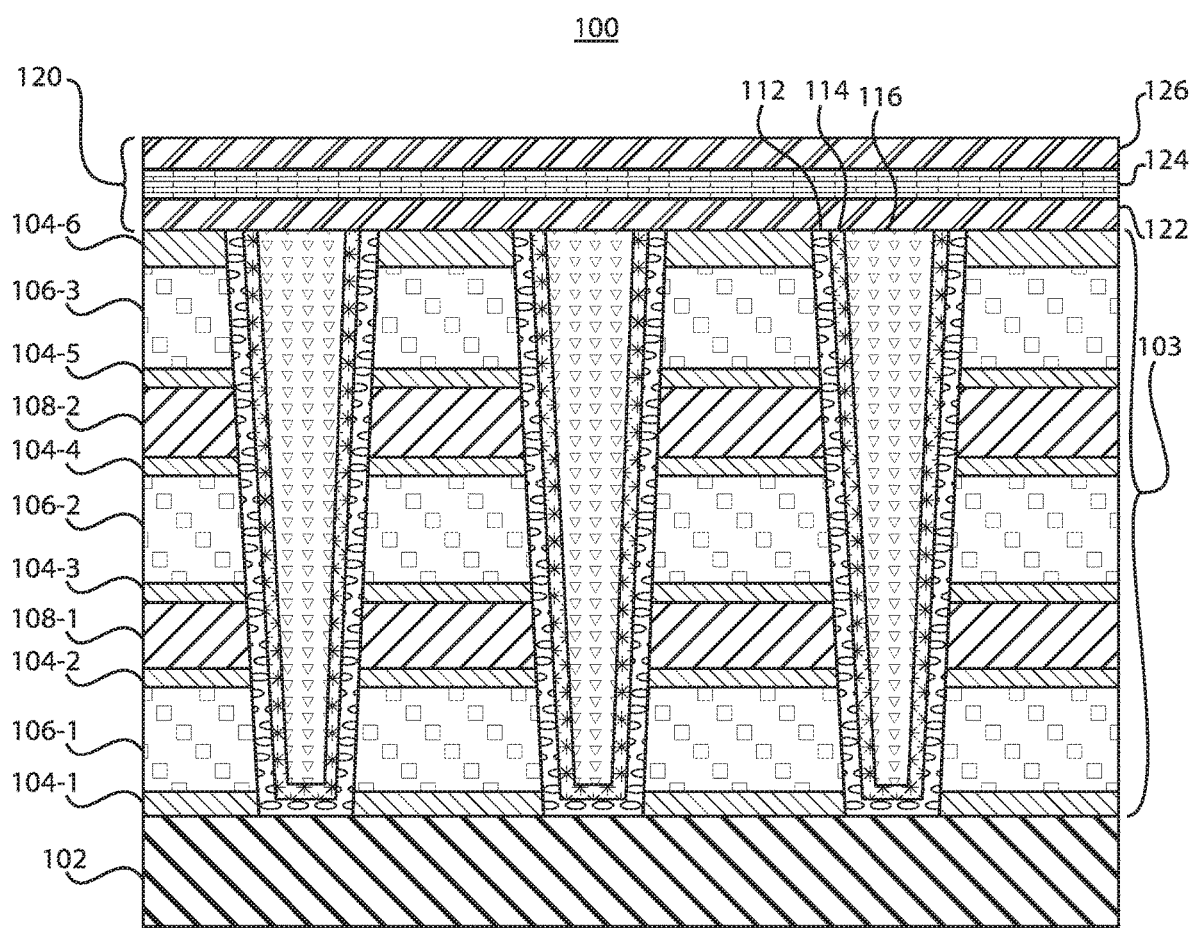
FIG. 10 is a cross-sectional view through the semiconductor device of FIG. 9, in accordance with an embodiment of the present invention.

With reference to FIG. 10, a cross-sectional view of the device 100 through line 5-5' is provided. As shown, a planar memory device stack (e.g., planar ReRAM stack) 120 is formed across the device 100. The planar memory device stack 120 can include a dielectric layer 124 (e.g., a thin dielectric layer) formed between a bottom layer 122 and a top layer 126. In one embodiment, the dielectric layer 124 can include a metal oxide. For example, the dielectric layer 124 can include, e.g., a hafnium oxide material (e.g., $HfO_2$), a tantalum oxide material (e.g., $Ta_2O_5$), or other suitable materials. The bottom layer 122 and the top layer 126 can include any suitable material in accordance with the embodiments described herein. For example, one or more of the bottom layer 122 and the top layer 126 can include, e.g., a titanium nitride material (e.g., TiN), although other materials are contemplated. In one embodiment, and as shown in FIG. 10, the bottom layer 122 and the top layer 126 can include the same material. However, such an embodiment should not be considered limiting, and the bottom layer 122 and the top layer 126 can include different materials in other embodiments.

Figure 11:
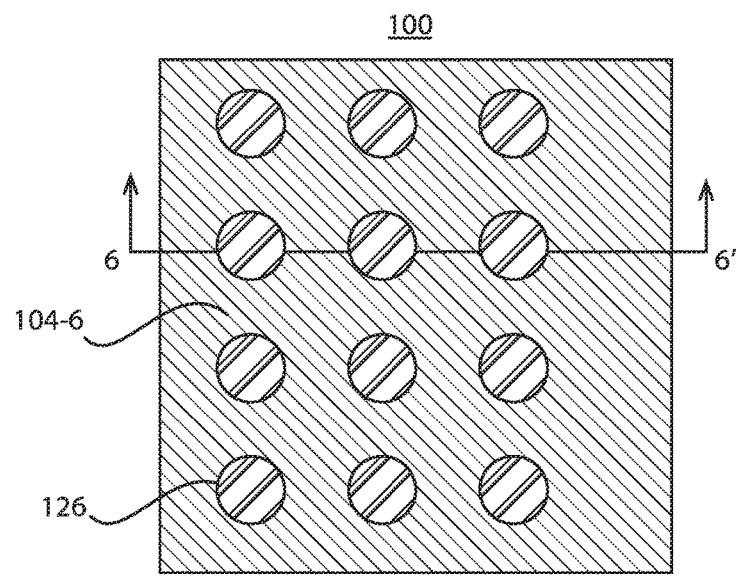
FIG. 11 is a top-down view of planar memory device patterning performed during the fabrication of the semiconductor device, in accordance with an embodiment of the present invention.

With reference to FIG. 11, a top-down view of the device 100 is provided illustrating planar memory stack (e.g., planar ReRAM stack) patterning performed in accordance with one embodiment. In this embodiment, the planar memory stack patterning can result in the vertical memory devices and the planar memory devices being connected in series. Further details regarding the memory device stack patterning of FIG. 11 will now be described with reference to FIG. 12.

Figure 12:
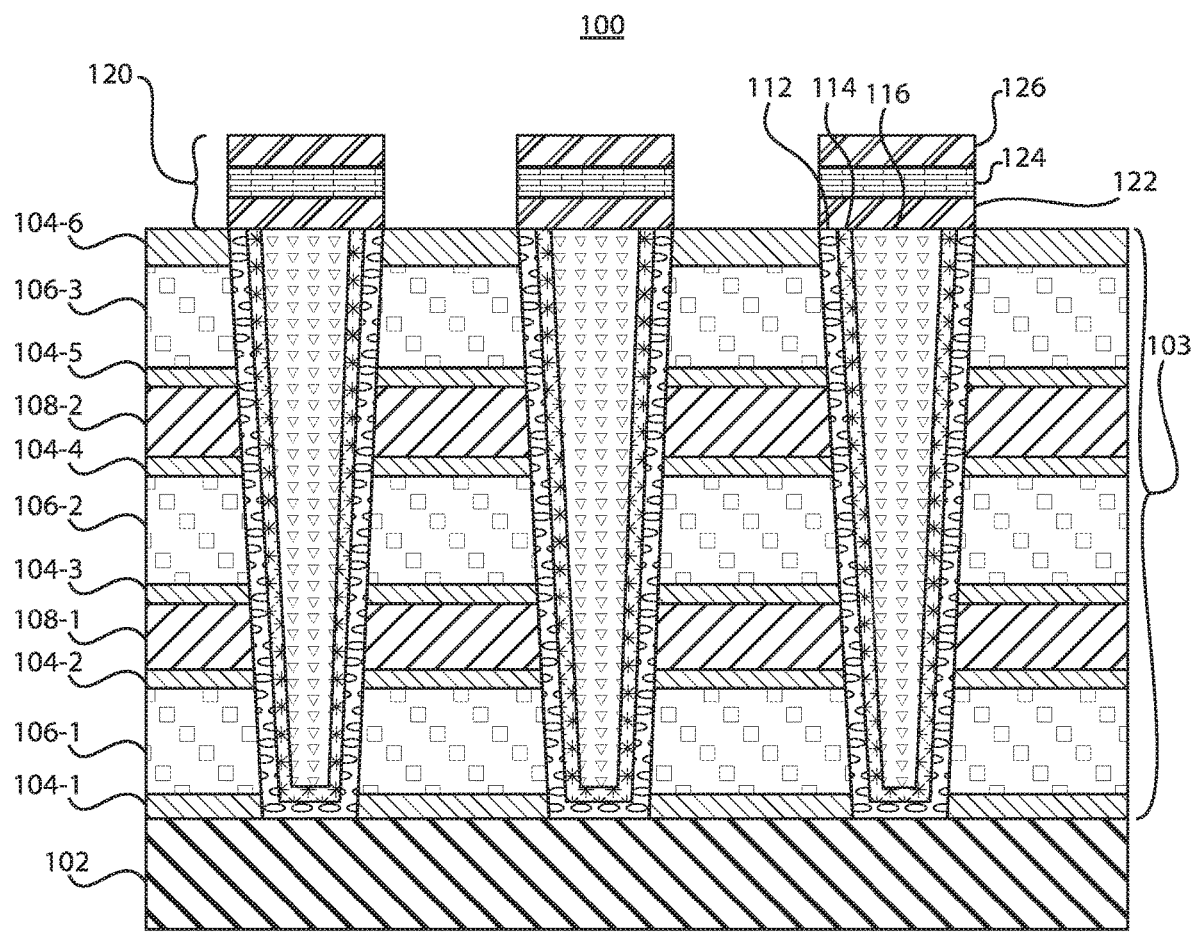
FIG. 12 is a cross-sectional view through the semiconductor device of FIG. 11, in accordance with an embodiment of the present invention.

With reference to FIG. 12, a cross-sectional view of the device 100 through line 6-6' is provided. As shown, portions of the planar memory device stack 120 are removed (e.g., etched) such that the remaining layers 122-126 of the stack 120 are disposed on the vertical electrodes 116 and corresponding layers 112 and 114 of the vertical memory device stack 113.

Figure 13:
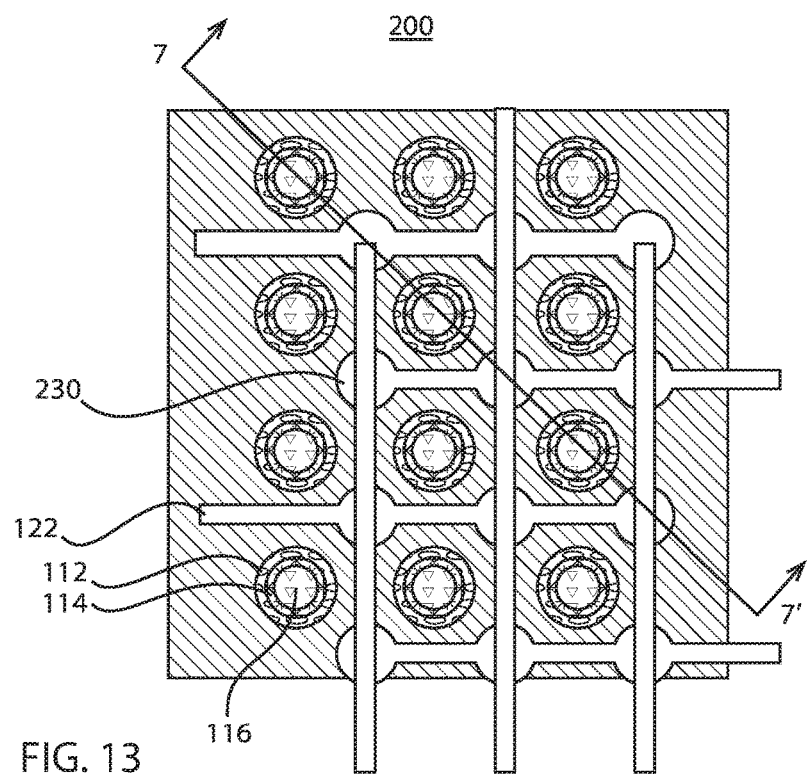
FIG. 13 is a top-down view of planar memory device patterning performed during the fabrication of the semiconductor device, in accordance with an embodiment of the present invention.

With reference to FIG. 13, a top-down view of a semiconductor device 200 is provided. It is assumed that the device 200 has been processed in accordance with FIGS. 1-10. However, the device 200 is shown illustrating planar electrode patterning performed in accordance with an alternative embodiment. In this embodiment, the planar electrode patterning can result in independent devices. As shown, planar electrodes 230 corresponding to the planar memory devices are formed. The electrodes 230 are on a plane above the vertical memory devices defined by layers 112-116. The bottom electrode line that connects the planar memory devices is the layer 122 located between the vertical electrodes 116 and corresponding layers 112 and 114 of the vertical memory device stack 113. Further details regarding the electrode patterning of FIG. 13 will now be described with reference to FIG. 14.

Figure 14:
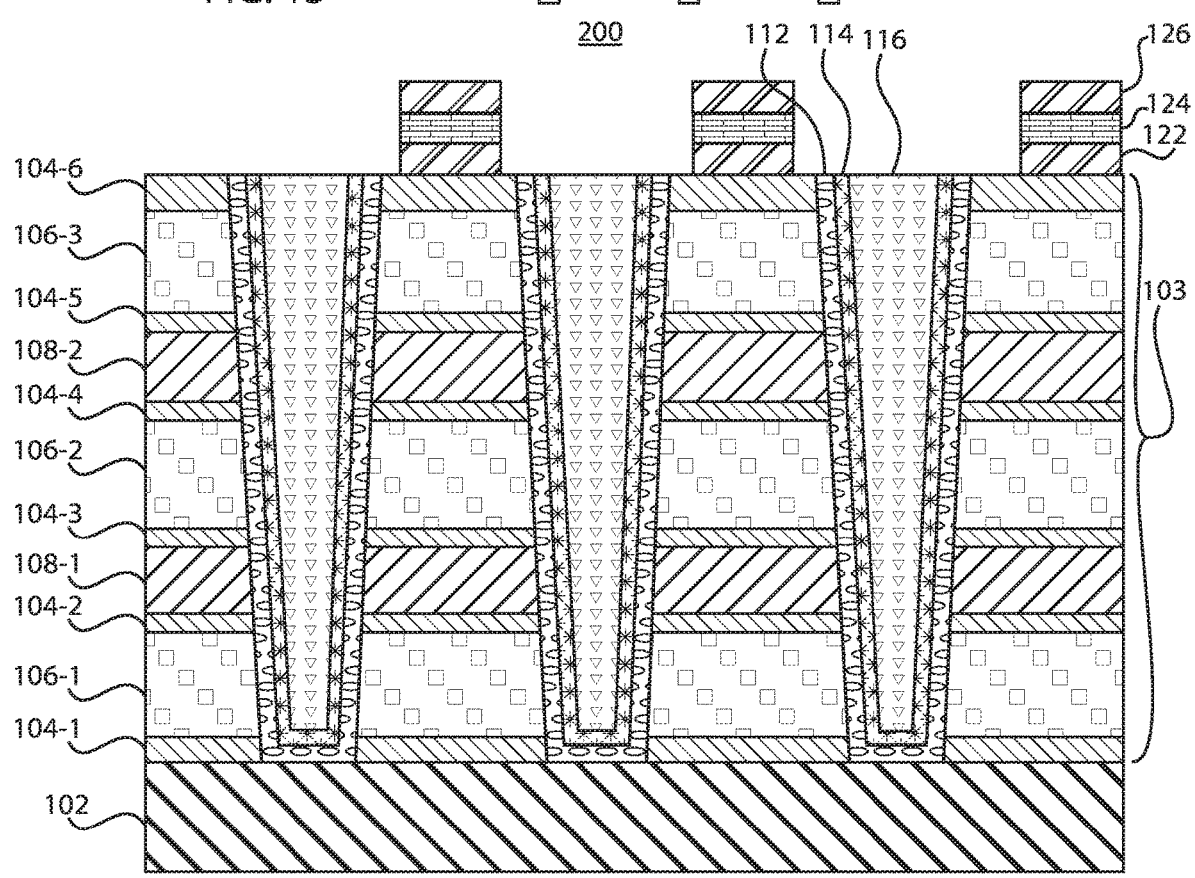
FIG. 14 is a cross-sectional view through the semiconductor device of FIG. 13, in accordance with an embodiment of the present invention.

With reference to FIG. 14, a cross-sectional view of the device 200 through line 7-7' is provided. As shown, portions of the stack 120 are removed (e.g., etched) such that the remaining layers 122-126 of the stack 120 are disposed in regions between the vertical electrodes 116 and corresponding layers 112 and 114 of the vertical memory device stack 113.

Figure 15:
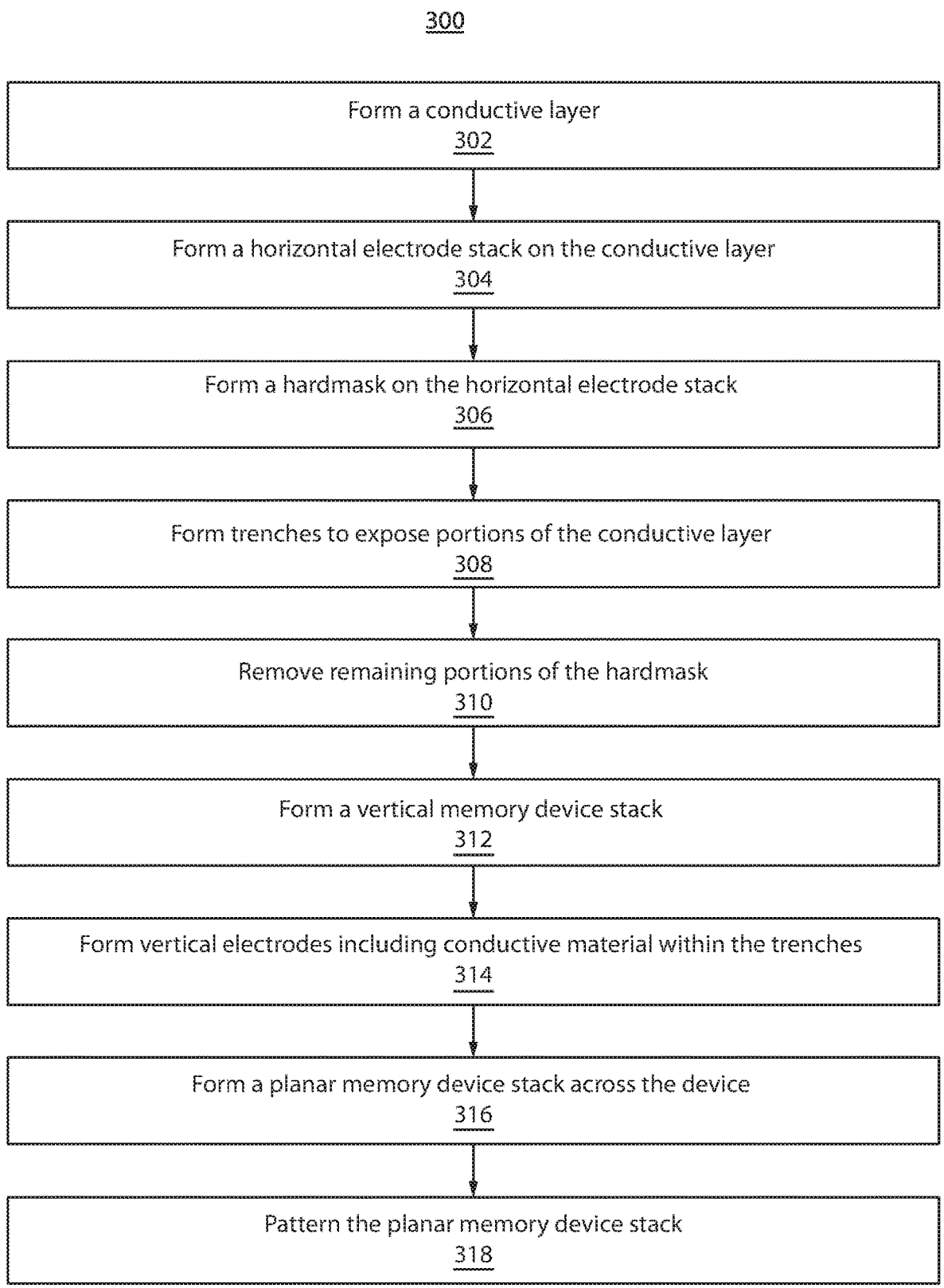
FIG. 15 is a block/flow diagram illustrating a system/method for fabricating a semiconductor device, in accordance with an embodiment of the present invention.

With reference to FIG. 15, a block/flow diagram is shown illustrating a system/method 300 for fabricating a semiconductor device.

At block 302, a conductive layer is formed. In one embodiment, the conductive layer includes a metal. Examples of suitable materials for the conductive layer include, but are not limited to, copper (Cu), tungsten (W), cobalt (Co) and/or aluminum (Al).

At block 304, a horizontal electrode stack is formed on the conductive layer. The horizontal electrode stack can include a plurality of layers including a base dielectric layer disposed on the conductive layer, and alternating sets of layers disposed on the base dielectric layer. For example, a first set of layers can be formed on the base dielectric layer, and a second set of layers can be formed on the first set of layers. For example, the base dielectric layer can include, e.g., a silicon nitride material (e.g., SiN), the first set of layers can include, e.g., a silicon nitride material (e.g., SiN) and a silicon dioxide material (e.g., $SiO_2$), and the second set of layers can include, e.g., a silicon nitride material (e.g., SiN) and a titanium nitride material (e.g., TiN).

At block 306, a hardmask is formed on the horizontal electrode stack. The hardmask can be formed using any suitable process in accordance with the embodiments described herein. For example, the hardmask can be deposited using, e.g., chemical vapor deposition (CVD) and/or related methods, and can include any suitable material in accordance with the embodiments described herein. Examples of suitable materials that can be used to form the hardmask can include, but are not limited to, silicon oxides, silicon carbides, silicon nitrides, silicon carbonitrides, spin-on dielectrics, etc. Spin-on dielectrics that can be utilized as material for the hardmask 110 include, but are not limited to, silsequioxanes, siloxanes, boron phosphate silicate glass (BPSG), etc.

At block 308, trenches are formed to expose portions of the conductive layer. For example, the trenches can be formed within the first horizontal electrode stack by etching corresponding portions of the device through the hardmask to the conductive layer. Any suitable process can be used to form the trenches in accordance with the embodiments described herein.

At block 310, remaining portions of the hardmask are removed. Any suitable process can be used to remove the remaining portions of the hardmask in accordance with the embodiments described herein.

At block 312, a vertical memory device stack (e.g., vertical ReRAM stack) is formed. The vertical memory device stack can include a dielectric layer (e.g., a thin dielectric layer) and a reactive electrode layer. For example, the dielectric layer can be deposited (e.g., conformally) along exposed surfaces of the layers of the first planar memory device stack and the conductive layer, and the reactive electrode layer can be deposited (e.g., conformally) along the dielectric layer. The dielectric layer and the reactive electrode layer can be formed using any suitable processes and can include any suitable materials in accordance with the embodiments described herein. In one embodiment, the dielectric layer can include a metal oxide. Examples of suitable materials that can be used to form the dielectric layer include, but are not limited to, a hafnium oxide material (e.g., $HfO_2$), a tantalum oxide material (e.g., $Ta_2O_5$), etc. In one embodiment, the reactive electrode layer can include an alloy. For example, the reactive electrode layer can include, e.g., a Ti and/or Al-containing material (e.g., TiN/TiAlC/TiN).

At block 314, vertical electrodes including conductive material are formed within the trenches. The vertical electrodes can be formed by filling the trenches with the conductive material, and planarizing to stop on the first planar electrode stack. The vertical electrodes can include any suitable material in accordance with the embodiments described herein. Examples of suitable materials that can be used to form the vertical electrodes include, but are not limited to, tungsten (W), copper (Cu), etc. Any suitable planarization method can be used in accordance with the embodiments described herein (e.g., chemical-mechanical planarization (CMP)).

At block 316, a planar memory device stack (e.g., planar ReRAM stack) is formed across the device. The planar memory device stack can include a dielectric layer (e.g., a thin dielectric layer) formed between a bottom layer and a top layer. The dielectric layer can include a metal oxide. Examples of suitable materials that can be used to form the dielectric layer include, but are not limited to, a hafnium oxide material (e.g., $HfO_2$), a tantalum oxide material (e.g., $Ta_2O_5$), etc. The bottom layer and the top layer can include any suitable material in accordance with the embodiments described herein. For example, one or more of the bottom layer and the top layer can include, e.g., a titanium nitride material (e.g., TiN), although other materials are contemplated. In one embodiment, the bottom layer and the top layer include the same material.

At block 318, the planar memory device stack is patterned. The planar memory device stack patterning forms a planar memory device (e.g., planar ReRAM device) from the planar memory device stack.

In one embodiment, the planar memory device stack patterning can result in the planar memory device being connected in series with the vertical memory devices. For example, portions of the planar memory device stack can be removed (e.g., etched) such that remaining layers of the planar memory device stack are disposed on the vertical electrodes and corresponding layers of the vertical memory device stack.

In another embodiment, the planar memory device stack patterning can result in independent devices. Here, the planar memory device stacks can be located on a plane above the vertical memory devices, and between the vertical electrodes and the corresponding layers of the vertical memory device stack. The bottom electrode line for the planar memory devices can be the bottom layer of the planar memory device stack.

Further details regarding the process described with reference to blocks 310-370 of FIG. 15 are described above with reference to FIGS. 1-14.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A method for fabricating a semiconductor device including three-dimensional and planar memory device co-integration, comprising:
   forming trenches within a horizontal electrode stack to expose portions of a conductive layer;
   forming a vertical memory device stack, including forming a dielectric layer on the horizontal electrode stack and the conductive layer, and forming a reactive electrode layer on the dielectric layer;
   forming vertical electrodes including conductive material within the trenches;
   forming a planar memory device stack across the device; and
   patterning the planar memory device stack to form a planar memory device.

2. The method of claim 1, wherein forming the vertical memory device stack further includes conformally depositing the dielectric layer along exposed surfaces of layers of the horizontal electrode stack and the conductive layer, and conformally depositing the reactive electrode layer along the dielectric layer.

3. The method of claim 1, wherein forming the trenches further includes forming a hardmask on the first planar electrode stack, and etching corresponding portions of the device through the hardmask to the conductive layer.

4. The method of claim 1, wherein patterning the planar memory device stack results in the planar memory device being connected to a vertical memory device in series.

5. The method of claim 1, wherein patterning the planar memory device stack results in independent planar and vertical memory devices.

6. The method of claim 1, wherein the vertical memory device stack is formed prior to forming the vertical electrodes.

7. The method of claim 1, wherein the semiconductor device includes a resistive random-access memory (ReRAM) device.

8. The method of claim 1, wherein the trenches are disjoint from each other.

9. The method of claim 1, wherein forming the planar memory device stack further includes forming a dielectric layer between a bottom layer and a top layer.

10. The method of claim 9, wherein the bottom layer and the top layer include a same material.

11. The method of claim 1, further comprising forming the horizontal electrode stack on the conductive layer.

12. The method of claim 11, wherein forming the horizontal electrode stack further includes disposing a base dielectric layer on the conductive layer, and disposing alternating sets of layers on the base dielectric layer.

13. The method of claim 12, wherein the alternating sets of layers include a first set of layers including a silicon nitride material disposed on a silicon dioxide material, and a second set of layers including a silicon nitride material disposed on a titanium nitride material formed on the first set of layers.

14. A semiconductor device including three-dimensional and planar memory device co-integration, comprising:
   a horizontal electrode stack disposed on a conductive layer;
   a vertical memory device including vertical electrodes within the horizontal electrode stack; and
   a planar memory device independent from the vertical memory device;
   the vertical memory device and the planar memory device each further including a respective conformal reactive electrode layer disposed on a conformal dielectric layer.

15. The device of claim 14, wherein the planar memory device includes a dielectric layer disposed between a bottom layer and a top layer.

16. The device of claim 14, wherein the semiconductor device includes a resistive random-access memory (ReRAM) device.

17. A semiconductor device including three-dimensional and planar memory device co-integration, comprising:
   a horizontal electrode stack disposed on a conductive layer;
   a vertical memory device including vertical electrodes within the horizontal electrode stack; and
   a planar memory device disposed on the vertical memory device and connected to the vertical memory device in series;
   the vertical memory device and the planar memory device each further including a respective conformal reactive electrode layer disposed on a conformal dielectric layer.

18. The device of claim 17, wherein the planar memory device includes a dielectric layer disposed between a bottom layer and a top layer.

19. The device of claim 17, wherein the semiconductor device includes a resistive random-access memory (ReRAM) device.

* * * * *